United States Patent [19]

Nasr

[11] Patent Number: 4,912,061
[45] Date of Patent: Mar. 27, 1990

[54] METHOD OF FORMING A SALICIDED SELF-ALIGNED METAL OXIDE SEMICONDUCTOR DEVICE USING A DISPOSABLE SILICON NITRIDE SPACER

[75] Inventor: Andre I. Nasr, Marlboro, Mass.

[73] Assignee: Digital Equipment Corporation, Maynard, Mass.

[21] Appl. No.: 176,837

[22] Filed: Apr. 4, 1988

[51] Int. Cl.⁴ .................. H01L 21/283; H01L 21/318
[52] U.S. Cl. ........................................ 437/44; 437/41;
437/56; 437/200; 437/241; 148/DIG. 19;
148/DIG. 147
[58] Field of Search ............... 437/200, 192, 41, 43,
437/44, 157, 56, 57, 58, 241; 148/DIG. 19,
DIG. 147; 357/54

[56] References Cited

U.S. PATENT DOCUMENTS

| | | | |
|---|---|---|---|
| 4,378,628 | 4/1983 | Levinstein et al. | 357/67 |
| 4,404,733 | 9/1983 | Sasaki | 29/571 |
| 4,622,735 | 11/1986 | Shibata | 29/571 |
| 4,728,617 | 3/1988 | Woo et al. | 437/154 |
| 4,745,086 | 5/1988 | Parmillo et al. | 437/57 |

FOREIGN PATENT DOCUMENTS

| | | | |
|---|---|---|---|
| 0111706 | 6/1984 | European Pat. Off. | 437/200 |
| 0096764 | 5/1986 | Japan . | |

OTHER PUBLICATIONS

Ghandlin, *VISI Fabrication Principles*, John Wiley & Sons, 1983, pp. 420–429.
Sai-Halasz et al.; "Experimental Technology . . . ", IEDM Tech. Digest, 1987, pp. 397–400.

Primary Examiner—Brian E. Hearn
Assistant Examiner—T. N. Quach
Attorney, Agent, or Firm—Arnold, White & Durkee

[57] ABSTRACT

A method of fabricating a SALICIDED self aligned metal oxide semiconductor device using a disposable silicon nitride spacer, metal silicide and a single implant step for the source, drain and gate regions is disclosed. The fabrication of the device is accomplished in seven major steps: First, on a substrate having an oxide layer, an undoped polysilicon layer defining the gate region is deposited. Second, an oxide layer is grown and then a silicon nitride layer is deposited. Third, the oxide and the silicon nitride layers are selectively etched, leaving the oxide and the nitride layers on the walls of the polysilicon gate region. Fourth, a cobalt layer is deposited on the wafer and processed to form cobalt silicide, after which the cobalt that did not come in contact with the silicon or the polysilicon gate region is removed. Fifth, the nitride layer on the walls of the gate region is removed. Sixth, a single ion implant step is used to form the N-channel Transistors of the device. Seventh, a single ion implant step is used to form the P-channel transistor of the device.

18 Claims, 2 Drawing Sheets

METHOD OF FORMING A SALICIDED SELF-ALIGNED METAL OXIDE SEMICONDUCTOR DEVICE USING A DISPOSABLE SILICON NITRIDE SPACER

BACKGROUND OF THE INVENTION

The Complementary Metal Oxide Semiconductor (CMOS) technology has been recognized as the leading technology for use in digital electronics in general and for use in many computer products in particular. This is because the Integrated Circuits (IC) formed on silicon wafers using CMOS technology have high density, operate at high speed and have a low standby power consumption. The basic building blocks of such integrated circuits are N-Channel and P-Channel type transistors. Despite these advantages, the CMOS technology has been associated with high sheet resistance in the source and drain regions of the transistors as well as in the polysilicon films frequently used to form the gate regions. This high sheet resistance is detrimental to the basic operations of the CMOS device, such as the speed and power consumption.

Self-aligned silicided (SALICIDED) metal oxide semiconductor techniques are frequently used to reduce the sheet resistance of a CMOS device thereby improving speed characteristics of the device. In this technique, a thin film of metal, such as Titanium (Ti), Cobalt (Co) etc., is reacted with the source, drain and polysilicon regions under specified environmental conditions. The thin film of metal is reacted with the silicon to form a layer of silicide. Thus, cobalt and titanium are reacted with silicon to form Cobalt Silicide ($CoSi_2$) and Titanium Silicide ($TiSi_2$) respectively. The silicide layer has a lower sheet resistance than the sheet resistance of silicon. During the manufacturing process, a silicide layer when formed at a low temperature prevents the formation of a silicide layer over silicon dioxide or silicon nitride, two extensively used insulating materials during the processing of semiconductor devices. Further, the unreacted metal film formed over oxide or silicon nitride can be etched using chemical wet agents without adversely affecting the silicide formed in the polysilicon and silicon regions. Cobalt Silicide ($CoSi_2$) is generally preferred because of its resistance to attack by wet chemical etching agents like Hydrofluoric Acid (HF), and its low affinity to adhere to oxides in the field oxide region (Isolation region) or the spacer region (Transistor region).

To prevent electrical shorting of adjacent silicided regions, i.e., the source, gate and drain regions, prior art processes utilize oxide (Silicon Dioxide-$SiO_2$) spacers to isolate these regions. Depending on the design rules, process requirements, tolerances, junction width, junction depth, spacer width, etc., the SALICIDED CMOS process, however, has resulted in increased manufacturing process steps. Among them are a separate masking and implant of a dopant (a conductivity-type impurity) in the source, drain and gate regions of one type of Transistor (N-channel), followed by the masking add implant of a dopant in the source, drain and gate regions of the second type Transistor (P-channel). This is followed by the spacer formation, Reactive Ion Etch (RIE) to selectively etch the insulating materials. The next step is to again mask the P-channel transistor and ion implant the N-type dopant. This is again followed by masking the N-channel transistor and implanting the P-type dopant to obtain adequate junction depths. This is then followed or preceded by the formation of a silicide layer. This process could result in a total of four masking steps and four ion implant steps to form the CMOS (N-channel and P-Channel) Transistors.

Previous attempts to reduce the number of masking steps and the number of implants have included utilizing oxide spacers having a thickness of less than 600 Angstroms (Å) Use of such thin spacers enables the source and drain dopant diffusion final depth to completely overlap tee polysilicon region, thereby reducing the sheet resistance of the source and drain regions and thus improving the threshold voltage control of each Transistor. The use of such thin spacers creates repeatability and controlability problems during the deposition and etching steps of the manufacturing process.

The instant invention discloses a method of forming a very thin oxide spacer by utilizing a disposable nitride (Silicon Nitride-$Si_3N_4$) space. This method of the invention reduces the number of steps during the manufacturing of a SALICIDED CMOS device from four masking steps (two masking steps each for N & P-channel Transistors) and four dopant implants (two implants each for N & P Transistors) to two masking steps (one for P-channel and one for N-channel Transistors) and two dopant implants (one for N and one for P-channel Transistors). The method of the invention is especially useful when smaller and shallower source and drain regions are desired. The method further enables one to form very shallow source and drain regions which completely surround the silicide layer and completely overlap the polysilicon gate region.

SUMMARY OF THE INVENTION

A method of fabricating a SALICIDED complementary metal oxide semiconductor utilizing a very thin oxide spacer and a disposable nitride layer is disclosed. The method of the invention includes the steps of forming a polysilicon gate region having near vertical walls on a silicon substrate but separated by an oxide layer, forming an oxide layer and a nitride layer, selectively removing the oxide and nitride layers except from the walls of the gate region, forming a conductive silicide layer in the polysilicon gate region and in two spaced apart regions in the substrate where the source and drain regions would be formed, removing the nitride layer from the walls of the gate region, and introducing conductivity-type impurities to desired junction depths in the polysilicon gate regions and in the silicon substrate through the two spaced apart silicided regions to form the gate, source and drain to form the desired channel type transistor.

Examples of the more important features of this invention have thus been summarized rather broadly in order that the detailed description thereof that follows may be better understood, and in order that the contribution of the art may be better appreciated. There are, of course, additional features of the invention that will be described hereinafter and which will also form the subject of the claims appended hereto.

These and other features and advantages of the present invention will become apparent with reference to the following detailed description of a preferred embodiment thereof in connection with the accompanying drawings wherein like reference numerals have been applied to like elements, in which:

DESCRIPTION OF THE PREFERRED EMBODIMENT

A method of forming a SALICIDED complementary metal oxide semiconductor device having silicided active regions separated by a thin oxide spacer wherein the source, drain and gate regions of each transistor being formed by a single dopant implant is described.

For ease of understanding the method of the instant invention, FIGS. 1-7 illustrate only one transistor of a CMOS device. FIG. 8 illustrates a P-channel transistor. A CMOS device contains an N-channel and a P-channel transistor. Hereinafter, reference is generally made to an N-channel transistor. The method and process described herein, however, is equally applicable to the formation of a P-channel transistor.

Figure 1:
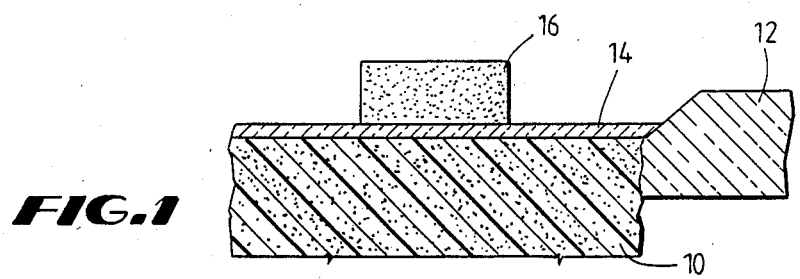
FIG. 1 illustrates the cross section of a region of a silicon substrate having an oxide layer, a polysilicon gate region and an oxide isolation trench.

FIG. 1 illustrates a portion of a silicon wafer having a substrate 10, an isolation region or trench 12, a gate oxide layer 14 and an undoped polysilicon region 16. For the purpose of this invention FIG. 1 illustrates the starting point. The starting point for fabricating CMOS devices is a silicon substrate 10. An isolation region 12, generally silicon dioxide, is formed to electrically isolate adjacent devices such as transistors to be fabricated on the same wafer. A base or gate oxide layer 14 is formed on the region where the transistor will be formed. The thickness of this oxide layer 14 may be about 100Å. It will be noted that any conventional method or process may be used to form the isolation region 12 and the gate oxide 14. Next, an undoped polysilicon layer 16 is deposited on a predetermined area over the gate oxide layer 14. The polysilicon layer is then patterned and etched to yield a gate region about 0.75 micrometer ($\mu$m) wide and having near vertical walls. The polysilicon layer 16 thus defines the gate region of the transistor.

Figure 2:
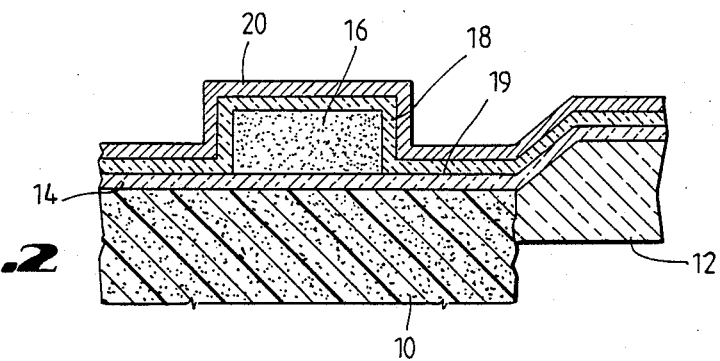
FIG. 2 illustrates the formation of an oxide layer and a silicon nitride layer on the device of FIG. 1.

Referring now to FIG. 2, after the gate region 16 is formed, wafers are exposed to an oxidizing ambient or atmosphere to form an oxide layer or region 18 about 150 Å thick. The line 19 separating the two oxide layers 14 and 18 is indistinguishable because these layers are composed of the same material, i.e., the oxide layers 14 and 18 in fact is only one layer. A silicon nitride layer ($Si_3N_4$) 20 about 600 Å thick is then formed on the oxide layer 18. The thickness of both the oxide and nitride layers entire wafer is generally uniform thereby retaining the vertical walled structure of the gate region. It will be noted that the thickness specified hereinabove are given for clarification purposes only. Thicknesses other than the ones noted above may be used to accomplish the same result within the spirit of the instant invention.

Figure 3:
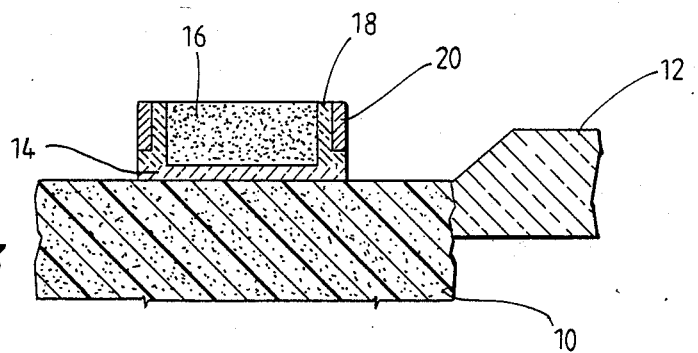
FIG. 3 illustrates the device of FIG. 2 wherein the oxide and silicon nitride layers have been selectively etched.

The wafer are then subjected to a selective etching process where the horizontal portions of the oxide layer 18 and the nitride layer 20 are removed, leaving the vertical spacers 18' and 20' around the walls of the polysilicon gate region 16 as illustrated in FIG. 3. The selective etching described above may be done by subjecting wafers to anisotropic etch in a Reactive Ion Etch (RIE) equipment. The anisotropic process enables one to remove only the horizontal part of the oxide ($SiO_2$) and nitride ($Si_3N_4$) layers 18 and 20 respectively, and leaving the vertical side walls or spacers 18' and 20'. The vertical nitride spacer 2', to be stripped eventually is utilized to protect the very thin oxide spacer 18' and the polysilicon region 16 from damage during the etching process. The use of this disposable nitride spacer enables one to utilize a very thin oxide layer 18 as illustrated in FIG. 2. The thin oxide spacer is very desirable because it enables the formation of shallow source and drain regions which completely overlap the polysilicon gate region. It will be noted that if a nitride layer 20' is not formed on the thin oxide layer 18' as illustrated in FIG. 2, the etching process used to remove the horizontal oxide layer could result in a wide variation in thickness of the thin oxide spacer wall, and possibly damage the gate oxide region.

Figure 4:
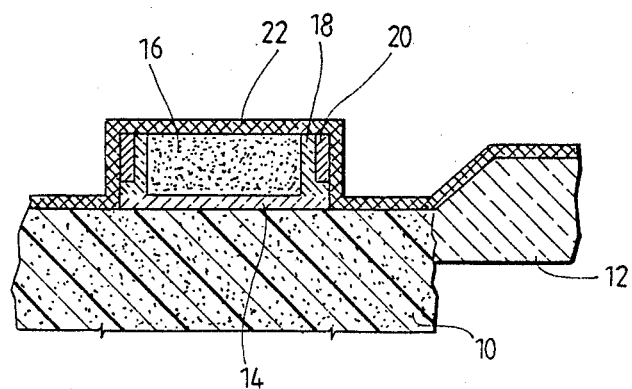
FIG. 4 illustrates the deposition of a metal layer on the device of FIG. 3.
Figure 5:
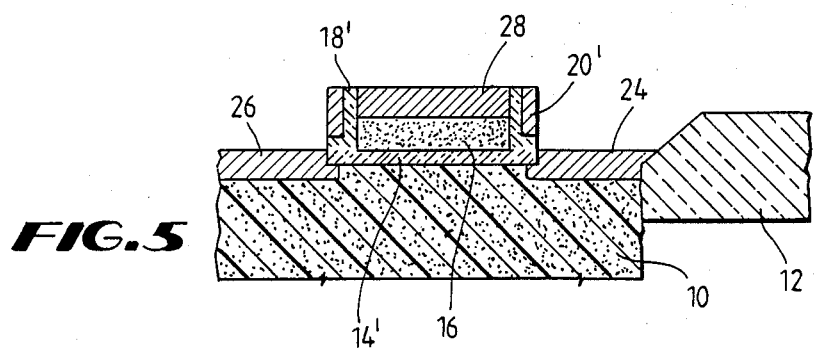
FIG. 5 illustrates the silicidation of the metal layer illustrated in FIG. 4 forming silicide in the polysilicon gate region and two spaced apart regions in the silicon wafer.

Now referring to FIG. 4, a thin layer 22 (about 250 Å thick) of a suitable conductive metal such as cobalt, titanium, nickel or the like is deposited over the wafer. The wafer is then heated to a temperature and for a time sufficient to form the corresponding metal silicide over the regions where the silicon wafer and polysilicon regions are exposed to the conductive metal. Regions 24, 26 and 28 in FIG. 5 illustrate the silicide regions. It will be noted that as the heating step proceeds, the metal is converted into silicide and the metal/silicon interface moves deeper in the silicon region. This interface depth is a function of the thickness of the metal deposited on the wafer. Further, cobalt or titanium silicide will penetrate into the substrate deeper than the gate oxide layer 14' and will also completely overlap the boundaries of the gate oxide layer 14 as illustrated by region 21 in FIGS. 5-7.

Figure 6:
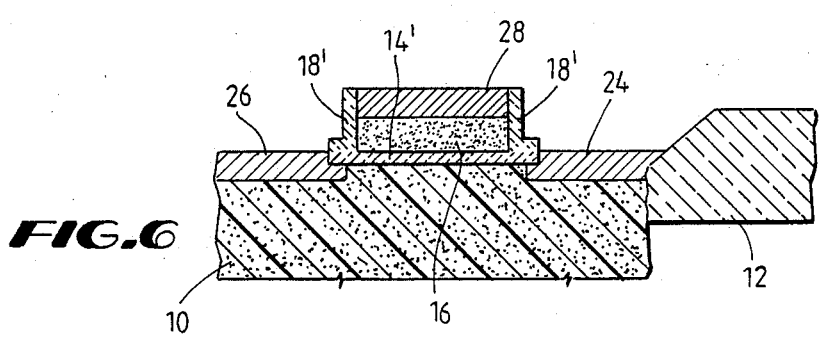
FIG. 6 illustrates the device of FIG. wherein the silicon nitride spacer has been etched.

The metal will not react with the oxide or nitride layers during the heating process thus leaving spacers 18' and 20' unaffected. The metal layer which was deposited over the field oxide and nitride layers on the vertical walls is then etched using a wet chemical etchant or any other available method. The chemicals used as etchant do not attack the metal silicide regions 24, 26 and 28. The wafers are then exposed to a chemical wet etchant, such as hot Phosphoric acid in the case of cobalt, which is an agent capable of removing the nitride layer 20' without adversely affecting the oxide spacer 18' or cobalt silicide layers 24, 26 and 28. The resultant device is illustrated in FIG. 6. An important result of the method described thus far is the formation of an extremely thin and very reliable oxide spacer 18'.

Figure 7:
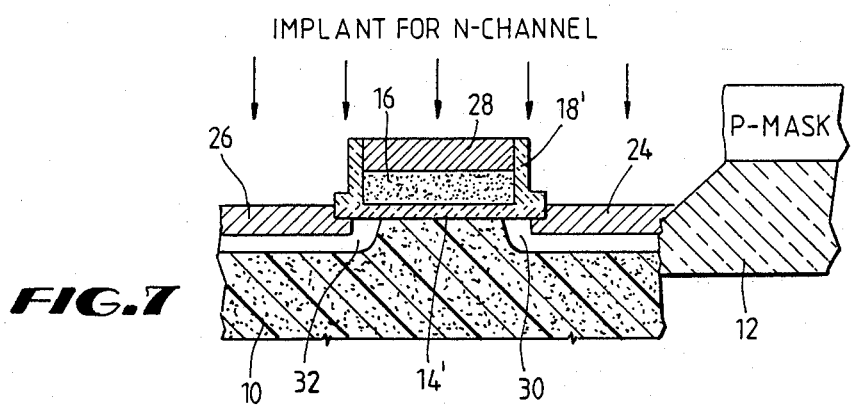
FIG. 7 illustrates the device of FIG. 6 with the source, drain and gate regions implanted with an N-type dopant.
Figure 8:
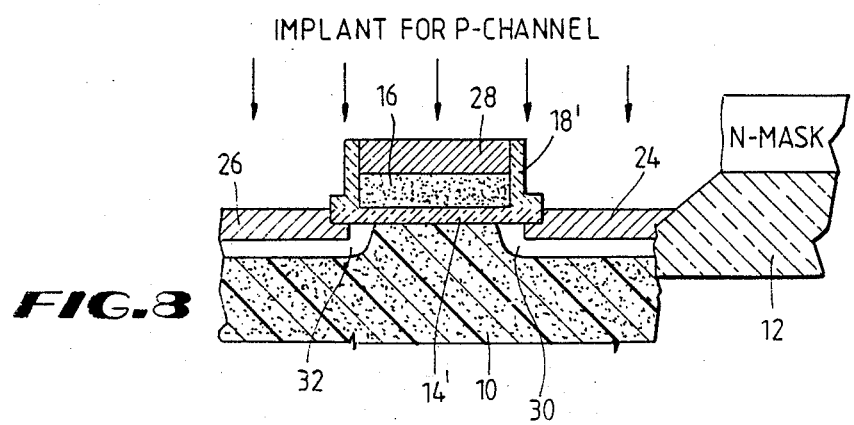
FIG. 8 illustrates the device of FIG. 6 with the source, drain and gate regions implanted with a P-type dopant.

Next, a photoresist masking step (P-mask) to protect the P-channel devices from N-type impurity (dopant) is used as illustrated in FIG. 7. An impurity (dopant) of a desired conductivity, i.e., an "N" type, is then implanted to form contact regions 30 and 32 to a desired depth. The region 30 and 32 completely overlap the respective side of the boundaries of the gate oxide layer 14' as illustrated in FIG. 7. In a similar manner, a mask photoresist masking step is used to protect the N-channel devices during P-type impurity implant to form P-channel transistors as illustrated in FIG. 8. Arsenic is generally used as an N-type impurity to form N-type regions while boron is often used to form P-type regions. The thin oxide spacer 18' enables one to implant dopant to form shallow junctions which completely overlap the gate oxide layer while isolating the drain and source regions from the polysilicon gate region. The method thus described only uses two masking steps. First for masking P-channel Transistors to enable one to implant N-type dopant simultaneously in the source drain and gate regions and second for masking the N-channel Transistors to implant the source drain and gate regions of the P-channel transistor. The method described above is especially useful when transistors with smaller source and drain regions and shallow junction depth are needed. It will be noted that when devices having deep junction depth are adequate in a desired application, it may not be necessary to remove the nitride spacer 18' prior to the masking and dopant implant steps described above. However, in most high speed digital electronics applications the transistors in the CMOS devices are required to have small source and drain regions and shallow junction depths.

The foregoing description has been directed to particular embodiments of the invention for the purposes of illustration and explanation. It will be apparent, however, to those skilled in this art that many modifications and changes in the embodiments set forth will be possible without departing from the scope and spirit of the invention. It is intended that the following claims be interpreted to embrace all such modifications and changes.

What is claimed is:

1. A method of fabricating a metal oxide semiconductor device on a silicon substrate having a base layer of silicon dioxide on its surface, said method comprising the steps of:
   (a) forming a polysilicon region having near vertical walls on a surface of the silicon dioxide base layer;
   (b) forming a second silicon dioxide layer on the exposed surfaces of the silicon dioxide base layer and the polysilicon region;
   (c) forming a silicon nitride layer on the second silicon dioxide layer;
   (d) selectively removing portions of the base and second silicon dioxide layers and the nitride layer while leaving the second silicon dioxide layer and the nitride layer on the walls of the gate region;
   (e) forming conductive silicide in the gate region and in two spaced apart regions in the substrate;
   (f) removing the nitride layer from the walls of the gate region while leaving the second silicon dioxide layer on the walls of the polysilicon region; and
   (g) introducing a conductivity-type impurity in the polysilicon region and through the two spaced apart regions in the silicon substrate to form gate, source, and drain regions.

2. A method of fabricating a metal oxide semiconductor device on a silicon substrate comprising the steps of:
   (a) forming a first silicon dioxide layer on the substrate;
   (b) forming a polysilicon region having near vertical walls on a portion of the first silicon dioxide layer, said polysilicon region defining a gate region;
   (c) forming a second silicon dioxide layer on the first silicon dioxide layer and the gate region;
   (d) forming a silicon nitride layer on the second silicon dioxide layer;
   (e) selectively etching portions of the silicon nitride layer and the first and second oxide layers while leaving the nitride and the second oxide layers on the vertical walls of the gate region;
   (f) forming conductive silicide in the gate region and in two spaced apart areas in the substrate along the opposite sides of the gate region;
   (g) removing the nitride layer from the vertical walls of the polysilicon region while leaving the second silicon dioxide layer on the walls of the polysilicon region; and
   (h) introducing a conductivity-type impurity through the two spaced apart areas in the silicon wafer to form shallow source and drain regions, said source and drain regions completely surrounding the first silicon dioxide layer under the gate region of their respective sides.

3. A method of fabricating a metal oxide semiconductor device comprising the steps of:
   (a) on a silicon wafer having a first silicon dioxide layer, forming a polysilicon gate region on the first silicon dioxide layer, said gate region having near vertical walls;
   (b) forming a second silicon dioxide layer on the device formed in step (a);
   (c) forming a silicon nitride layer on the device formed in step (b);
   (d) selectively removing portions of the first and second silicon dioxide layers and the silicon nitride layer while leaving the silicon nitride and the second silicon dioxide layers only on the walls of the polysilicon gate region;
   (e) forming conductive metal silicide in the polysilicon gate region and in two separate source and drain spaced apart regions in the silicon substrate along the opposite sides of the polysilicon gate region;
   (f) removing the silicon nitride layer from the walls of the polysilicon gate region while leaving the second silicon dioxide layer thereon; and
   (g) ion-implanting a conductivity-type impurity through the two spaced apart metal silicide regions to form spaced apart source and drain, said source aNd drain completely surrounding one side each of the first oxide layer underneath their respective side of the gate region.

4. The method of fabricating a metal oxide semiconductor device as defined in claim 3 wherein the second oxide layer has thickness of about 150 Angstroms.

5. The method of fabricating a metal oxide semiconductor device according to claim 4 wherein the silicon nitride layer has a thickness of about 600 Angstroms.

6. The method of fabricating a metal oxide semiconductor device according to claim 4 wherein the impurity is an N-type impurity.

7. The method of fabricating a device according to claim 4 wherein the impurity is a P-type impurity.

8. The method of fabricating a device according to claim 3 wherein metal silicide is titanium silicide.

9. The method of fabricating a device according to claim 3 wherein the metal silicide is cobalt silicide.

10. A method of fabricating a metal oxide semiconductor device on a silicon wafer comprising the steps of;
  (a) forming a first oxide layer on the wafer;
  (b) forming an undoped polysilicon gate region having near vertical walls;
  (c) forming a second oxide layer about 150 Angstroms thick on the wafer and the undoped polysilicon region;
  (d) forming a silicon nitride ($Si_3N_4$) layer about 600 Angstroms thick on the second oxide layer;
  (e) selectively removing portions of the silicon nitride layer and the first and second oxide layers leaving the second oxide layer and the silicon nitride layer only on the walls of the undoped polysilicon gate region;
  (f) depositing a cobalt layer on two spaced apart regions on the wafer and on the undoped polysilicon gate region;
  (g) heating the device after step (f) at a temperature and for a time sufficient to form CoSi in the polysilicon gate region, and to form CoSi in the spaced apart regions in the silicon wafer;
  (h) annealing the device after step (h) to transform CoSi formed in step (g) into $CoSi_2$, said $CoSi_2$ having electrical resistance lower than the resistance of the undoped polysilicon gate region and the silicon wafer;
  (i) removing the silicon nitride layer from the walls of the gate region while leaving the second oxide layer thereon; and
  (j) introducing a conductivity-type impurity after step (i) through the two spaced apart $CoSi_2$ regions to form a source and a drain, said source and drain completely overlapping their respective spaced apart $CoSi_2$ regions and one side each of the first oxide layer underneath their respective side of the gate region.

11. A method of fabricating a CMOS device on a silicon wafer having two electrically isolated areas, each side area having a base oxide layer on a portion thereof and a polysilicon gate region having near vertical walls on each said base oxide layer, said method comprising the steps of;
  (a) forming a uniform second oxide layer on the wafer;
  (b) forming a uniform nitride layer on the second oxide layer;
  (c) selectively removing the nitride and the second oxide layers so as to leave the nitride and second oxide layers on the walls of the polysilicon gate regions;
  (d) forming metal silicide regions in the polysilicon gate regions and in two spaced apart areas in the silicon wafer along the opposite sides of each of the polysilicon regions such that each said spaced apart metal silicide region completely overlaps the base oxide layer underneath its respective side of the polysilicon gate region;
  (e) removing the nitride layer from the walls of the polysilicon gate regions while leaving the second oxide layer thereon;
  (f) masking one said isolated area;
  (g) introducing a first conductivity-type impurity in the polysilicon gate region and through the two spaced apart metal silicide regions in the second isolated area to form the gate, drain and source of a first transistor;
  (h) masking the second said isolated area; and
  (i) introducing a second conductivity-type impurity in the polysilicon gate region and through the two spaced apart metal silicide regions in the first isolated area to form the gate, source and drain of a second transistor.

12. The method as described in claim 11 wherein the first and second conductive-type impurities are of N-type and P-type respectively.

13. The method of claim 11 wherein the metal used is cobalt.

14. The method of claim 11 wherein the metal used is titanium.

15. The method of claim 11 wherein the second oxide and nitride layers are about 150 Å and 600 Å thick, respectively.

16. The method of claim 15 wherein the base oxide layer is about 100 Å thick.

17. The method of claim 11 wherein the impurities introduced through each of the spaced apart region completely overlaps its corresponding metal silicide layer and one side of its respective base oxide layer.

18. The method of claim 11 wherein selective removal of the nitride and the second oxide layer is done by Reactive Ion etching method.

* * * * *

UNITED STATES PATENT AND TRADEMARK OFFICE
CERTIFICATE OF CORRECTION

PATENT NO. : 4,912,061
DATED : March 27, 1990
INVENTOR(S) : Andre I. Nasr

It is certified that error appears in the above-identified patent and that said Letters Patent is hereby corrected as shown below:

Column 1, line 60, delete "add" and insert therefor -- and --.

Column 2, line 10, delete "tee" and insert therefor -- the --; line 19, delete "space." and insert therefor -- spacer. --.

Column 6, line 53, "aNd" and insert therefor -- and --.

Signed and Sealed this

Ninth Day of July, 1991

Attest:

HARRY F. MANBECK, JR.

Attesting Officer   Commissioner of Patents and Trademarks